United States Patent
Hyodo

(10) Patent No.: US 9,229,069 B2
(45) Date of Patent: Jan. 5, 2016

(54) METHOD FOR DETECTING METAL FOREIGN OBJECT ON CONTACTLESS POWER SUPPLY DEVICE, CONTACTLESS POWER SUPPLY DEVICE, CONTACTLESS POWER RECEPTION DEVICE, AND CONTACTLESS POWER SUPPLY SYSTEM

(71) Applicant: Panasonic Corporation, Osaka (JP)

(72) Inventor: Satoshi Hyodo, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 338 days.

(21) Appl. No.: 13/632,261

(22) Filed: Oct. 1, 2012

(65) Prior Publication Data

US 2014/0091787 A1    Apr. 3, 2014

(51) Int. Cl.
*G01R 33/02* (2006.01)
*G01V 3/10* (2006.01)
*H02J 5/00* (2006.01)

(52) U.S. Cl.
CPC .............. *G01R 33/02* (2013.01); *G01V 3/101* (2013.01); *G01V 3/105* (2013.01); *H02J 5/005* (2013.01)

(58) Field of Classification Search
CPC ......... G01R 33/02; G01B 7/023; H02J 5/005; H02J 7/025; H02J 5/00; H01F 38/14; G01V 3/101–3/108; G01V 3/10
USPC .................. 324/236, 207.12, 207.13, 207.26; 307/29, 80, 104, 106, 109
See application file for complete search history.

(56) References Cited

U.S. PATENT DOCUMENTS

| 4,024,468 A | * | 5/1977 | Hirschi .......................... 324/329 |
| 4,628,265 A | * | 12/1986 | Johnson ................. G01V 3/107 324/225 |
| 8,183,828 B2 | | 5/2012 | Tanabe |

(Continued)

FOREIGN PATENT DOCUMENTS

| JP | 2000-295796 A | 10/2000 |
| JP | 2008-206213 A | 9/2008 |

(Continued)

OTHER PUBLICATIONS

German Office Action for corresponding German Application No. 10 2012 019 584.2 dated Jun. 5, 2013 and English translation.

(Continued)

*Primary Examiner* — Tung X Nguyen
*Assistant Examiner* — David Frederiksen
(74) *Attorney, Agent, or Firm* — Renner, Otto, Boisselle & Sklar, LLP

(57) ABSTRACT

With a metal foreign object detecting method, a metal detection circuit arranged in a contactless power supply device transmits an oscillation signal to a modulation circuit of an electric appliance. The modulation circuit generates a square wave pulse signal from the oscillation signal. The cycle of the oscillation signal received by the modulation circuit changes in accordance with whether or not a metal piece is present. The modulation circuit modulates the square wave pulse signal to generate a modulated wave signal and transmits the modulated wave signal to the metal detection circuit of the power supply device. The metal detection circuit demodulates the modulated wave signal and determines whether or not a metal piece is present based on the cycle of the demodulated signal corresponding to the square wave pulse signal.

12 Claims, 6 Drawing Sheets

(56) References Cited

U.S. PATENT DOCUMENTS

| | | | |
|---|---|---|---|
| 8,587,301 B2 * | 11/2013 | Derungs | 324/258 |
| 8,614,561 B2 | 12/2013 | Tanabe | |
| 2001/0023868 A1 * | 9/2001 | Aurre et al. | 219/518 |
| 2002/0093338 A1 * | 7/2002 | Rowan | 324/329 |
| 2006/0226833 A1 * | 10/2006 | Kubotera et al. | 324/236 |
| 2009/0015210 A1 * | 1/2009 | Kojima | B60L 3/04 320/163 |
| 2009/0174264 A1 | 7/2009 | Onishi et al. | |
| 2009/0224723 A1 | 9/2009 | Tanabe | |
| 2010/0270867 A1 | 10/2010 | Abe | |
| 2011/0140538 A1 * | 6/2011 | Jung | H02J 7/0027 307/104 |
| 2012/0212073 A1 * | 8/2012 | Azancot et al. | 307/104 |
| 2012/0235637 A1 | 9/2012 | Tanabe | |
| 2012/0313579 A1 | 12/2012 | Matsumoto et al. | |
| 2012/0326524 A1 * | 12/2012 | Matsumoto et al. | 307/104 |
| 2013/0015705 A1 * | 1/2013 | Abe | 307/29 |
| 2013/0099592 A1 | 4/2013 | Abe | |
| 2013/0328411 A1 | 12/2013 | Tanabe | |

FOREIGN PATENT DOCUMENTS

| | | |
|---|---|---|
| JP | 2009-219177 A | 9/2009 |
| TW | 200937794 A | 9/2009 |
| TW | 201208225 A | 2/2012 |
| TW | 201212459 A | 3/2012 |
| WO | WO 2012/002063 A1 | 1/2012 |

OTHER PUBLICATIONS

Möschwitzer et al., "Einführung in die Elektronik", VEB Verlag Technik Berlin, 1982, p. 149.

Taiwanese Office Action for corresponding Taiwan Application No. 101136503 dated Nov. 3, 2014 and English translation.

* cited by examiner

φt

MP

|←Tn→|

φm

DMP

|←Tn→|

φt

MP

|←—Tn—→|

φm

DMP

|←—Tn—→|

…

METHOD FOR DETECTING METAL FOREIGN OBJECT ON CONTACTLESS POWER SUPPLY DEVICE, CONTACTLESS POWER SUPPLY DEVICE, CONTACTLESS POWER RECEPTION DEVICE, AND CONTACTLESS POWER SUPPLY SYSTEM

TECHNICAL FIELD

The present invention relates to a method for detecting a metal foreign object on a contactless power supply device, a contactless power supply device, a power reception device, and a contactless power supply system.

BACKGROUND ART

Electromagnetic induction contactless power supply systems have become practical.

An electromagnetic induction contactless power supply system includes a contactless power supply device having a primary coil and a power reception device having a secondary coil. When an electric appliance including the power reception device is set on a setting surface of the contactless power supply device, the contactless power supply device excites the primary coil. Then, electromagnetic induction excites and supplies power to the secondary coil of the power reception device, which is arranged in an electric appliance. The secondary power generated in the secondary coil is converted to direct current (DC) power in the power reception device. The DC power is then supplied to a load of the electric appliance as driving power.

If a metal foreign object is present between the contactless power supply device and the electric appliance (power reception device), the metal foreign object may be inductively heated when power is being supplied. Accordingly, the contactless power supply device may include a metal detector that detects metal foreign objects. When the metal detector detects a metal foreign object, the contactless power supply device stops supplying power.

In one example, the metal detector in the contactless power supply device excites the primary coil of the contactless power supply device at a predetermined frequency, which differs from the frequency used when power is supplied. It is known that the presence of a metal foreign object changes the inductance of the primary coil, which is excited at the predetermined frequency. When detecting the presence of a metal foreign object based on the change in the inductance of the primary coil, the metal detector stops the supply of power (Japanese Laid-Open Patent Publication No. 2000-295796)

SUMMARY OF THE INVENTION

The above metal detector excites the primary coil of the contactless power supply device at a metal detection excitation frequency, which differs from the power supplying excitation frequency. Thus, the contactless power supply device is required to have a plurality of excitation frequencies set for the excitation of the primary coil. The contactless power supply device is also required to switch the excitation frequency whenever performing metal detection. This results in the circuitry for exciting and driving the primary coil being complicated thereby increasing the cost of the contactless power supply device.

Further, the metal detector detects a metal foreign object by detecting a change in the inductance of the primary coil, that is, a change in the resonance frequency of an oscillation circuit, which includes the primary coil. Thus, the metal is required to include an amplifier and a processor that process signals at high speeds. This further increases the cost of the contactless power supply device.

One aspect of the present invention is a method for detecting whether or not a metal foreign object is present on a contactless power supply device that supplies power to a power reception device included in an electrical appliance using an electromagnetic induction phenomenon. The method includes transmitting an oscillation signal from the contactless power supply device to the power reception device; detecting, from the oscillation signal received by the power reception device, a modulating wave based on a change in magnetic flux caused by the presence of a metal foreign object; generating a modulated wave signal by modulating a carrier signal in accordance with the modulating wave to transmit the modulating wave to the contactless power supply device, and transmitting the modulated wave signal from the power reception device to the contactless power supply device; and receiving the modulated wave signal transmitted from the power reception device with the contactless power supply device, and determining whether or not a metal foreign object is present based on a demodulated signal demodulated from the modulated wave signal.

In one example, the modulating wave is a square wave pulse signal derived from the oscillation signal received by the power reception device and having a cycle changed based on a change in magnetic flux caused by the presence of a metal foreign object. The modulated wave signal is generated by modulating an amplitude of the carrier signal in proportion to the square wave pulse signal. The demodulated signal is a square wave pulse signal generated by detecting an envelope of the modulated wave signal.

In one example, the carrier signal is the oscillation signal transmitted from the contactless power supply device to the power reception device.

In one example, the carrier signal is an electromagnetic wave signal generated based on a supplying current supplied to a secondary coil included in the power reception device, using an electromagnetic induction phenomenon, from a primary coil arranged in the contactless power supply device. The modulated wave signal is obtained by superimposing the modulating wave onto the electromagnetic wave signal.

A further aspect of the present invention is a contactless power supply device that supplies power to a power reception device included in electric appliance using an electromagnetic induction phenomenon. The contactless power supply device includes an oscillation circuit that transmits an oscillation signal to the power reception device. A wave detection circuit receives, from the power reception device receiving the oscillation signal, a modulated wave signal obtained by modulating the oscillation signal with a modulating wave based on a change in magnetic flux, detects the modulated wave signal, and demodulates the modulated wave signal detected by the power reception device. A frequency detection circuit detects a frequency of the modulating wave demodulated by the wave detection circuit. A determination circuit determines whether or not a metal foreign object is present based on the frequency of the demodulated modulating wave detected by the frequency detection circuit.

In one example, the modulating wave is a square wave pulse signal derived from the oscillation signal received by the power reception device and having a cycle changed based on a change in magnetic flux caused by the presence of a metal foreign object. The modulated wave signal is generated by modulating an amplitude of the carrier signal in proportion to the square wave pulse signal. The wave detection circuit is configured to demodulate the square wave pulse signal by detecting an envelope of the modulated wave signal. The frequency detection circuit is configured to detect a cycle of the square wave pulse signal demodulated by the wave detection circuit. The determination circuit determines whether a metal foreign object is present based on the cycle of the square wave pulse signal detected by the frequency detection circuit.

Another aspect of the present invention is a power reception device arranged in an electric appliance. The power reception device receives power from a contactless power supply device using an electromagnetic induction phenomenon. The power reception device includes an oscillation signal receiving circuit that receives, from the contactless power supply device, an oscillation signal used to detect whether or not a metal foreign object is present. A modulating wave signal generation circuit that generates, from the oscillation signal received by the oscillation signal receiving circuit, a modulating wave based on a change in magnetic flux caused by the presence of a metal foreign object. A modulated wave signal generation circuit generates a modulated wave signal by modulating a carrier signal in accordance with the modulating wave to transmit the modulating wave to the contactless power supply device.

In one example, the modulating wave is a square wave pulse signal. The modulating wave signal generation circuit is configured to generate the square wave pulse signal, from the received oscillation signal, with a cycle changed based on a change in magnetic flux caused by the presence of a metal foreign object. The modulated wave signal is generated by modulating an amplitude of the carrier signal in proportion to the square wave pulse signal. The modulating wave signal generation circuit is configured to generate the modulated wave signal by modulating an amplitude of the carrier signal in proportion to the square wave pulse signal.

The present invention is also directed to a contactless power supply system including the above power reception device and the above contactless power supply device.

Other aspects and advantages of the present invention will become apparent from the following description, taken in conjunction with the accompanying drawings, illustrating by way of example the principles of the invention.

BRIEF DESCRIPTION OF THE DRAWINGS

The novel features which are considered characteristic of the invention are set forth with particularity in the appended claims. The invention itself and additional objects and advantages thereof will best be understood from the following description of embodiments thereof when read in connection with the accompanying drawings, in which:

DETAILED DESCRIPTION OF THE EMBODIMENTS

A contactless power supply system according to one embodiment of the present invention will now be described with reference to the drawings.

Figure 1:
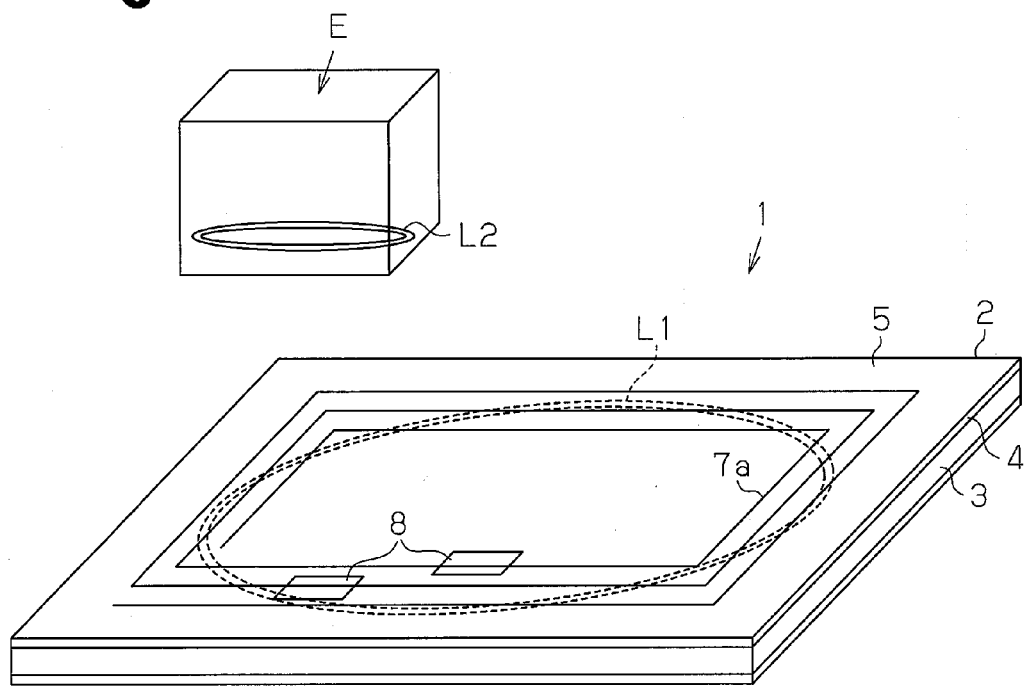
FIG. 1 is a perspective view showing a power supply device and an electric appliance in a contactless power supply system.

The contactless power supply system shown in FIG. 1 includes a contactless power supply device (hereafter simply referred to as a power supply device) 1 and an electric appliance (hereafter simply referred to as appliance) E that is supplied with power in a contactless manner by the power supply device 1. The power supply device 1 has a frame 2 including a tetragonal case 3 with an upper opening and a top panel 4 that closes the opening of the tetragonal case 3. The top panel 4 is formed by an insulator (for example, reinforced glass). The upper surface of the top panel 4 functions as a setting surface 5, on which the appliance E is set to supply power in a contactless manner. In the frame 2, a primary coil L1 is arranged on the rear surface of the top panel 4. In the present embodiment, the single primary coil L1 is arranged parallel to the setting surface 5 of the top panel 4.

When the appliance E is set on the setting surface 5, a secondary coil L2 arranged in the appliance E is excited and energized by electromagnetic induction that occurs when the primary coil L1 of the power supply device 1 is excited. Secondary power, induced at the secondary coil L2 due to electromagnetic induction, is then input to a power reception circuit 15 (refer to FIG. 3), which is arranged in the appliance E. The power is converted by the power reception circuit 15 to direct current (DC) voltage, which is free from ripples, and then supplied to a load Z of the appliance E.

A power supplying side first communication antenna coil 6a (hereafter referred to as a power supplying side first antenna coil) 6a is arranged on the rear surface of the top panel 4 surrounding the primary coil L1. Wireless communication is performed to transfer data and/or information between the power supplying side first antenna coil 6a and a power receiving side first communication antenna coil 6b (hereafter referred to as a power receiving side first antenna coil), which is arranged in the appliance E.

In one example, the power supplying side first antenna coil 6a and the power receiving side first antenna coil 6b perform wireless communication to transfer data and/or information between each other when the appliance E is set on the setting surface 5.

In the present embodiment, the appliance E transmits, through wireless communication, an appliance authorization signal ID and an excitation request signal RQ from the power receiving side first antenna coil 6b. The appliance authorization signal ID may contain identification information of the appliance E that receives power from the power supply device 1. The excitation request signal RQ requests the power supply device 1 to supply power. The power supplying side first antenna coil 6a receives the appliance authorization signal ID and the excitation request signal RQ.

A power supplying side second communication antenna coil 7a (hereafter referred to as a power supplying side second antenna coil) is arranged on the upper surface of the top panel 4, which is the setting surface 5 (may be the rear surface of the top panel 4). The power supplying side second antenna coil 7a is formed on the setting surface 5 by, for example, a known wire printing process. The power supplying side second antenna coil 7a and a power receiving side second communication antenna coil 7b (hereafter referred to as a power receiving side second antenna coil) arranged in the appliance E perform wireless communication to transfer data and/or information between each other.

In one example, the power supplying side second antenna coil 7a and the power receiving side second antenna coil 7b transfer signals to each other to detect whether or not a metal piece (metal foreign object) 8 is present on the setting surface 5 when the appliance E is set on the setting surface 5.

In the present embodiment, an oscillation circuit 33a in the power supply device 1 (refer to FIG. 8) generates an oscillation signal Φt (refer to FIG. 9A) to detect a metal piece 8 and transmits the oscillation signal Φt from the power supplying side second antenna coil 7a. The power receiving side second antenna coil 7b of the appliance E receives the oscillation signal Φt. A modulation circuit 16 of the appliance E (refer to FIG. 3) modulates the received oscillation signal Φt to generate a modulated signal (modulated wave signal) Φm (refer to FIG. 9C) and transmits the modulated wave signal Φm (refer to FIG. 9C) from the power receiving side second antenna coil 7b to the power supplying side second antenna coil 7a.

Figure 2:
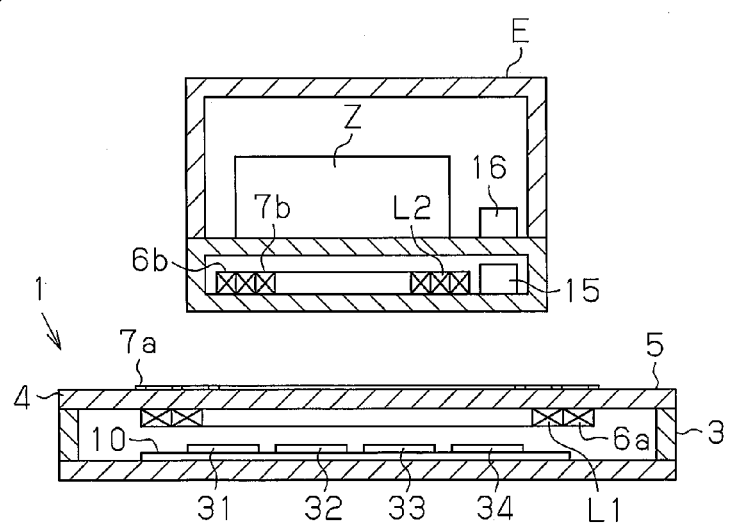
FIG. 2 is a cross-sectional view showing the power supply device and the electric appliance.

In the example shown in FIG. 2, a printed wiring board 10 is arranged on the inner bottom surface of the frame 2. A power circuit 31, a power supplying circuit 32, a metal detection circuit 33, and a system control unit 34 are set on the printed wiring board 10. The power supplying circuit 32 transfers power through electromagnetic induction to the appliance E set on the setting surface 5. The metal detection circuit 33 detects a metal piece 8 on the setting surface 5 in cooperation with the appliance E. The system control unit 34 includes a microcomputer for centrally controlling the power supply device 1.

The electrical structure of the power supply device 1 and the appliance E will now be described with reference to FIGS. 3 to 8.

Figure 3:
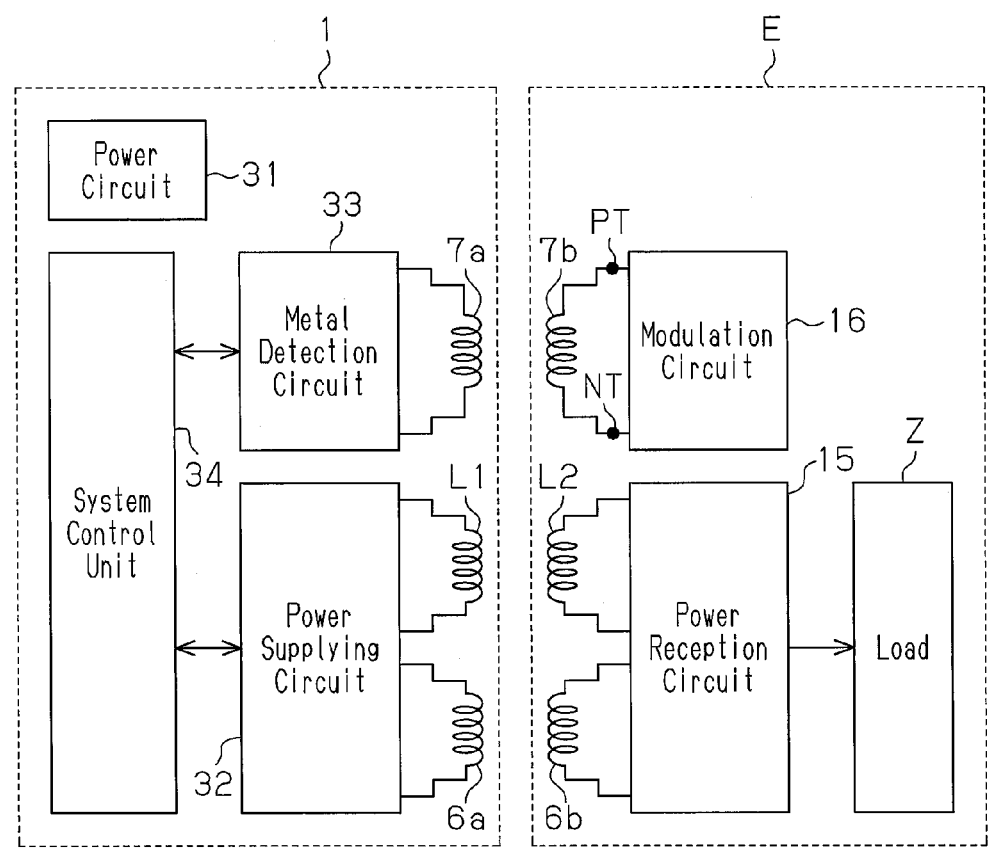
FIG. 3 is a block diagram showing the power supply device and the electric appliance.

As shown in FIG. 3, the appliance E includes the power reception circuit 15, which receives secondary power from the power supply device 1, the load Z, which is driven by the secondary power received by the power reception circuit 15, and the modulation circuit 16, which generates the modulated wave signal Φm used to detect a metal piece.

In one example, the power reception device may include the secondary coil L2 and the power reception circuit 15. In another example, the power reception device may include the second coil L2, the power reception circuit 15, and the modulation circuit 16. In still another example, the power reception device may include the appliance E excluding the load. The appliance E may also be entirely referred to as the power reception device.

Figure 4:
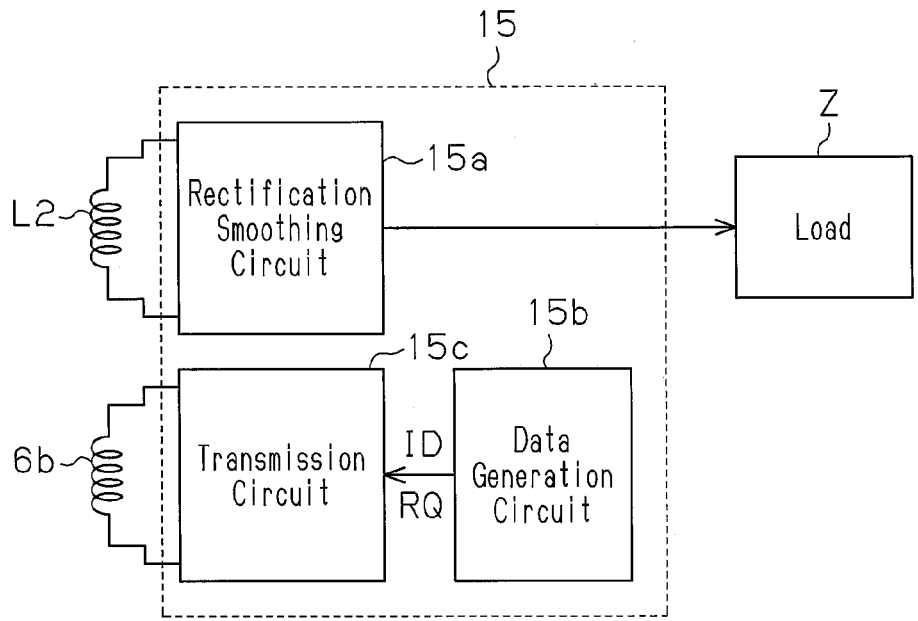
FIG. 4 is a block diagram of a power reception circuit arranged in the electric appliance.

The power reception circuit 15 receives the secondary power from the primary coil L1 via the secondary coil L2 and supplies a driving voltage to the load Z. As shown in FIG. 4, the power reception circuit 15 includes a rectification smoothing circuit 15a, a data generation circuit 15b, and a transmission circuit 15c.

The rectification smoothing circuit 15a is connected to the secondary coil L2. The rectification smoothing circuit 15a receives the secondary power, which has been supplied to the secondary coil L2 by electromagnetic induction caused by the excitation of the primary coil L1 in the power supply device 1, and converts the secondary power to a DC voltage that is free from ripples and supplies the DC voltage to the load Z of the appliance E.

The load Z may be any device driven by the secondary power generated with the secondary coil L2. The load Z may be, for example, a device driven on the setting surface 5 using the rectified DC current or a device driven on the setting surface 5 directly using the secondary power as AC power. The load Z may further be a device that charges an internal rechargeable battery (secondary battery) using the rectified DC voltage.

In a non-restrictive example, the rectification smoothing circuit 15a may function as a driving power supply that supplies the rectified DC voltage to the data generation circuit 15b and the transmission circuit 15c.

The data generation circuit 15b generates an appliance authorization signal ID and an excitation request signal RQ and provides the signals to the transmission circuit 15c. The appliance authorization signal ID is used by the power supply device 1 to authorize the appliance E to receive power transfer from the power supply device 1. The excitation request signal RQ requests the power supply device 1 to supply power.

The data generation circuit 15b generates an appliance authorization signal ID and an excitation request signal RQ when, for example, the rectification smoothing circuit 15a is outputting the DC power or when the appliance E is in a state in which it can be driven using, for example, its internal secondary battery. The data generation circuit 15b provides the generated signals to the transmission circuit 15c. The data generation circuit 15b does not generate the appliance authorization signal ID and the excitation request signal RQ when, for example, the power switch for driving the load Z of the appliance E is off.

When the appliance E includes a microcomputer, the data generation circuit 15b does not generates the appliance authorization signal ID and the excitation request signal RQ when the microcomputer determines that the supplying of power should be stopped.

The transmission circuit 15c is connected to the power receiving side first antenna coil 6b. The transmission circuit 15c transmits the appliance authorization signal ID and the excitation request signal RQ, which are provided from the data generation circuit 15b, to the power supply device 1 via the power receiving side first antenna coil 6b.

Figure 5:
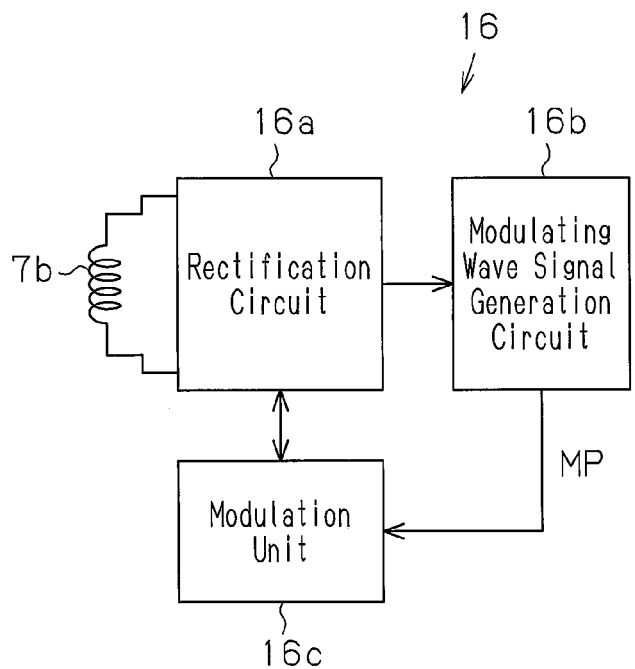
FIG. 5 is a block diagram of a modulation circuit arranged in the electric appliance.

The appliance E includes the modulation circuit 16, which modulates the oscillation signal Φt received via the power receiving side second antenna coil 7b from the power supply device 1. As shown in FIG. 5, the modulation circuit 16 includes a rectification circuit 16a, a modulating wave signal generation circuit 16b, and a modulation unit 16c. The rectification circuit 16a rectifies the oscillation signal Φt. The modulating wave signal generation circuit 16b generates a square wave pulse signal MP in accordance with the current rectified by the rectification circuit 16a. The modulation unit 16c modulates the oscillation signal Φt in accordance with the square wave pulse signal MP generated by the modulating wave signal generation circuit 16b to generate a modulated signal (modulated wave signal) Φm.

Figure 6:
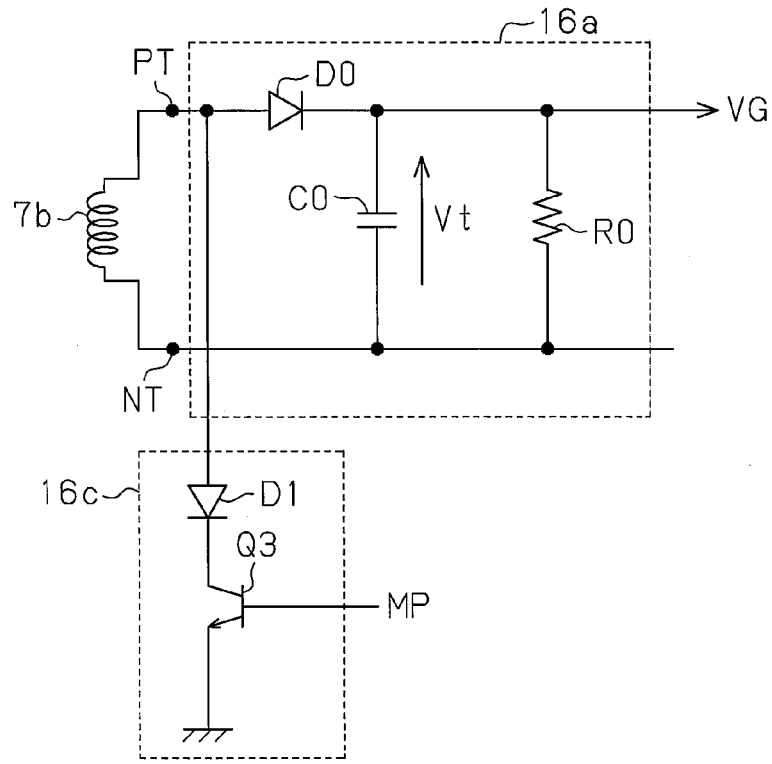
FIG. 6 is an electric circuit diagram showing a rectification circuit and a modulation unit arranged in the modulation circuit of the electric appliance.

In the example shown in FIG. 6, the rectification circuit 16a is a half-wave rectification circuit. The rectification circuit 16a includes a rectification diode D0, a charge-discharge capacitor C0, and a resistor R0. The rectifier diode D0 includes an anode terminal, connected to a positive terminal PT of the power receiving side second antenna coil 7b, and a cathode terminal, connected to a positive terminal of the charge-discharge capacitor C0. The charge-discharge capacitor C0 includes a negative terminal connected to a negative terminal NT of the power receiving side second antenna coil 7b. The resistor R0 is connected in parallel to the charge-discharge capacitor C0. The rectification circuit 16a receives the oscillation signal Φt transmitted from the power supplying side second antenna coil 7a arranged in the power supply device 1 via the power receiving side second antenna coil 7b and half-wave rectifies the received oscillation signal Φt.

Figure 9A:
FIGS. 9A, 9B, 9C, and 9D are waveform diagrams showing an oscillation signal, a square wave pulse signal, a modulated wave signal, and a demodulated signal when no metal piece is present.

As shown in FIG. 9A, the oscillation signal Φt transmitted from the power supply device 1 can be a sine wave having a fixed amplitude and a fixed frequency. When the oscillation signal Φt received by the power receiving side second antenna coil 7b is half-wave rectified by the rectification diode D0, the charge-discharge capacitor C0 is charged and discharged repeatedly. When, for example, the oscillation signal Φt has a positive potential, the charge-discharge capacitor C0 is charged by a current from the rectification diode D0. When the oscillation signal Φt has a negative potential, the capacitor C0 is discharged via the resistor R0.

A change in the frequency of the oscillation signal Φt varies the charging and discharging time of the capacitor C0. When, for example, a metal piece 8 is present between the power receiving side second antenna coil 7b and the power supplying side second antenna coil 7a in a state in which the appliance E is set on the setting surface 5, the frequency of the oscillation signal Φt received by the power receiving side second antenna coil 7b would vary from the frequency of the oscillation signal Φt transmitted from the power supply device 1.

The frequency of the oscillation signal Φt transmitted from the power supply device 1 may be referred to as a first frequency. The frequency of the oscillation signal Φt received by the power receiving side second antenna coil 7b may be referred to as a second frequency. The second frequency is the same as the first frequency when a metal piece 8 is not present and differs from the first frequency when a metal piece 8 is present. For example, when a metal piece 8 is not present, the power receiving side second antenna coil 7b receives an oscillation signal Φt having the same frequency as the first frequency oscillated by the oscillation circuit 33a, as shown in FIG. 9A. When a metal piece 8 is present, the power receiving side second antenna coil 7b receives an oscillation signal Φt having a relatively low frequency as shown in FIG. 9E and differing from the first frequency oscillated by the oscillation circuit 33a.

This indicates that the presence of a metal piece 8 lowers the frequency of the oscillation signal Φt and prolongs the charging and discharging time (charging and discharging cycle) of the charge-discharge capacitor C0. In other words, the charging voltage waveform would have a longer cycle when a metal piece 8 is present compared to when a metal piece 8 is not present. The charging voltage Vt of the charge-discharge capacitor C0 is then applied to the modulating wave signal generation circuit 16b as a power supply voltage VG.

Figure 7:
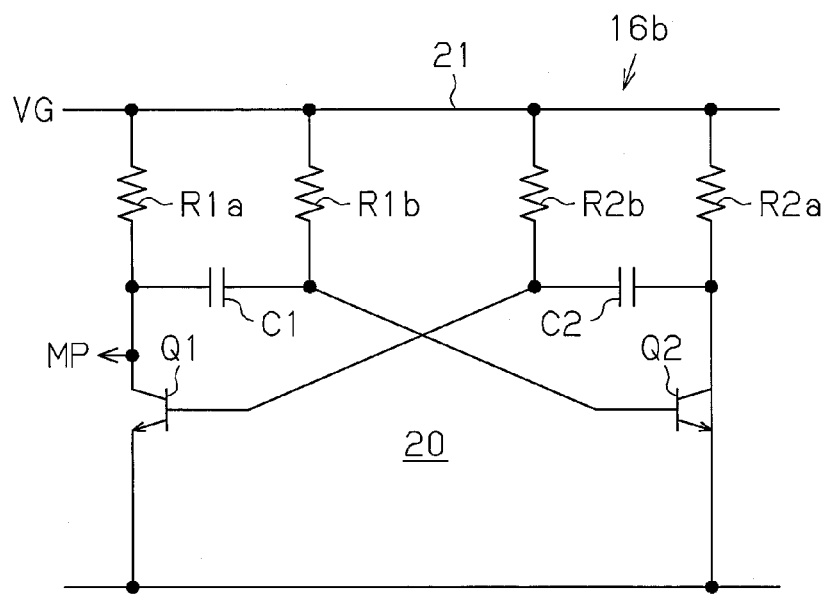
FIG. 7 is an electric circuit diagram of a modulating wave signal generation unit arranged in the modulation circuit of the electric appliance.

As shown in FIG. 7, the modulating wave signal generation circuit 16b may be formed by an astable multivibrator 20. The astable multivibrator 20 may be a known multivibrator known in the art, which includes two transistors Q1 and Q2, two capacitors C1 and C2, and four resistors R1a, R1b, R2a, and R2b.

The charging voltage Vt of the charge-discharge capacitor C0 is applied to a power wire 21 of the astable multivibrator 20 as the power supply voltage VG. The astable multivibrator 20 of the present embodiment provides a square wave pulse signal MP (modulating wave) from the collector terminal of the transistor Q1 to the modulation unit 16c.

More specifically, when the transistor Q1 of the astable multivibrator 20 is activated, the potential between the base and the emitter of the transistor Q2 is the difference obtained by subtracting the power supply voltage VG from a threshold (of, for example, 0.7 volts). This deactivates the transistor Q2. As a result, a current flows through the capacitor C1 via the resistor R1b, and charges the capacitor C1. This increases the potential between the base and the emitter of the transistor Q2. When the base-emitter potential of the transistor Q2 subsequently exceeds the threshold, the transistor Q2 is activated.

Activation of the transistor Q2 causes the potential between the base and the emitter of the transistor Q1 to be the difference obtained by subtracting the power supply voltage VG from the threshold. This deactivates the transistor Q1. As a result, current flows to the capacitor C2 via the resistor R2b and charges the capacitor C2. This increases the base-emitter potential of the transistor Q1. When the base-emitter potential of the transistor Q1 subsequently exceeds the threshold, the transistor Q1 is activated and the transistor Q2 is deactivated.

By repeating this process, the astable multivibrator 20 continuously outputs the square wave pulse signal MP from the collector terminal of the transistor Q1 (and from the transistor Q2 in the same manner).

In the present embodiment, the time required to switch the transistor Q1 (and the transistor Q2 in the same manner) from a deactivated state to an activated state is in accordance with the time required by the base-emitter potential of the transistor Q1 to exceed the threshold. In other words, the time required to switch the transistor Q1 from a deactivated state to an activated state depends on the power supply voltage VG that charges the capacitor C1 via the resistor R1b.

The astable multivibrator 20 uses the charging voltage Vt of the charge-discharge capacitor C2 as the power supply voltage VG. Thus, the cycle of the power supply voltage waveform is varied. This changes the cycle Tn of the square wave pulse signal MP output from the collector of the transistor Q1.

When a metal piece 8 is not present, the oscillation signal Φt having the frequency shown in FIG. 9A is received. As a result, a power supply voltage VG having a short power supply voltage waveform cycle is applied to the astable multivibrator 20. In this case, the base-emitter potentials of the transistors Q1 and Q2 exceed their thresholds in a relatively short period of time. Thus, the astable multivibrator 20 outputs the square wave pulse signal MP having the relatively short cycle Tn shown in FIG. 9B.

When a metal piece 8 is present, the oscillation signal Φt having the relatively low second frequency shown in FIG. 9E is received. As a result, a power supply voltage VG having a long power supply voltage waveform cycle is applied to the astable multivibrator 20. In this case, the base-emitter potentials of the transistors Q1 and Q2 exceed their thresholds over a relatively long period of time. Thus, the astable multivibrator 20 outputs the square wave pulse signal MP having the relatively long cycle Tn shown in FIG. 9F.

In this manner, the astable multivibrator 20 outputs the square wave pulse signal MP from the collector terminal of the transistor Q1 with a longer cycle Tn when the metal piece 8 is present than when a metal piece 8 is not present.

The astable multivibrator 20 provides the square wave pulse signal MP to the modulation unit 16c.

As shown in FIG. 6, the modulation unit 16c includes a transistor Q3 and a diode D1. The diode D1 includes an anode terminal connected to an anode terminal of the rectification diode D0 of the rectification circuit 16a and the positive terminal PT. The diode D1 includes a cathode terminal connected to a collector terminal of the transistor Q3. The transistor Q3 includes a base terminal connected to the transistor Q1 of the astable multivibrator 20 and an emitter terminal connected to ground.

The transistor Q3 is activated and deactivated in accordance with the square wave pulse signal MP, which is provided to its base terminal from the astable multivibrator 20.

When the transistor Q3 is activated, the charging current, which charges the charge-discharge capacitor C0 via the rectification diode D0, partially flows through the transistor Q3 (modulation unit 16c) via the diode D1. When the transistor Q3 is deactivated, the charging current, which charges the charge-discharge capacitor C0 via the rectification diode D0, flows to the charge-discharge capacitor C0 via the rectification diode D0 and does not flow to the transistor Q3 (modulation unit 16c).

As a result, the activation and deactivation of the transistor Q3 changes the secondary current flowing between the terminals PT and NT of the power receiving side second antenna coil 7b based on the oscillation signal Φt. The change in the secondary current changes the magnetic flux generated by the power receiving side second antenna coil 7b. The changed magnetic flux is then induced to the power supplying side second antenna coil 7a by electromagnetic induction. This changes the primary current flowing through the power supplying side second antenna coil 7a.

More specifically, the activation and deactivation of the transistor Q3 (with the cycle Tn of the square wave pulse signal MP) causes the current (oscillation signal Φt) flowing between the terminals PT and NT of the power receiving side second antenna coil 7b to undergo amplitude modulation. The modulated wave signal Φm is then transmitted from the power receiving side second antenna coil 7b to the power supplying side second antenna coil 7a.

In the illustrated example, the oscillation signal Φt received by the power receiving side second antenna coil 7b functions as a carrier signal. The square wave pulse signal MP generated in the appliance E based on the frequency of the carrier signal is an example of a modulating wave. The modulation unit 16c modulates the amplitude of the carrier signal (the oscillation signal Φt) in proportion to the modulating wave (square wave pulse signal MP) thereby generating the modulated wave signal Φm shown in FIG. 9C or 9G.

Figure 9B:
Figure 9C:

For example, the modulation unit 16c modulates the amplitude of the carrier signal (oscillation signal Φt) in accordance with the square wave pulse signal MP shown in FIG. 9B to generate the modulated wave signal Φm shown in FIG. 9C. The modulation unit 16c modulates the amplitude of the carrier signal (the oscillation signal Φt) in accordance with the square wave pulse signal MP shown in FIG. 9F to generate the modulated wave signal Φm shown in FIG. 9G.

In this manner, the envelope waveform of the modulated wave signal Φm has a cycle corresponding to the cycle Tn of the square wave pulse signal MP (modulating wave).

As shown in FIG. 3, the power supply device 1 includes the power circuit 31, the power supplying circuit 32, the metal detection circuit 33, and the system control unit 34.

The power circuit 31 includes a rectification circuit and a DC-DC converter. The power circuit 31 rectifies commercial power supplied from an external source with the rectification circuit, converts the rectified DC voltage to a predetermined voltage with the DC-DC converter, and supplies the DC voltage to the system control unit 34, the power supplying circuit 32, and the metal detection circuit 33 as their driving power.

Figure 8:
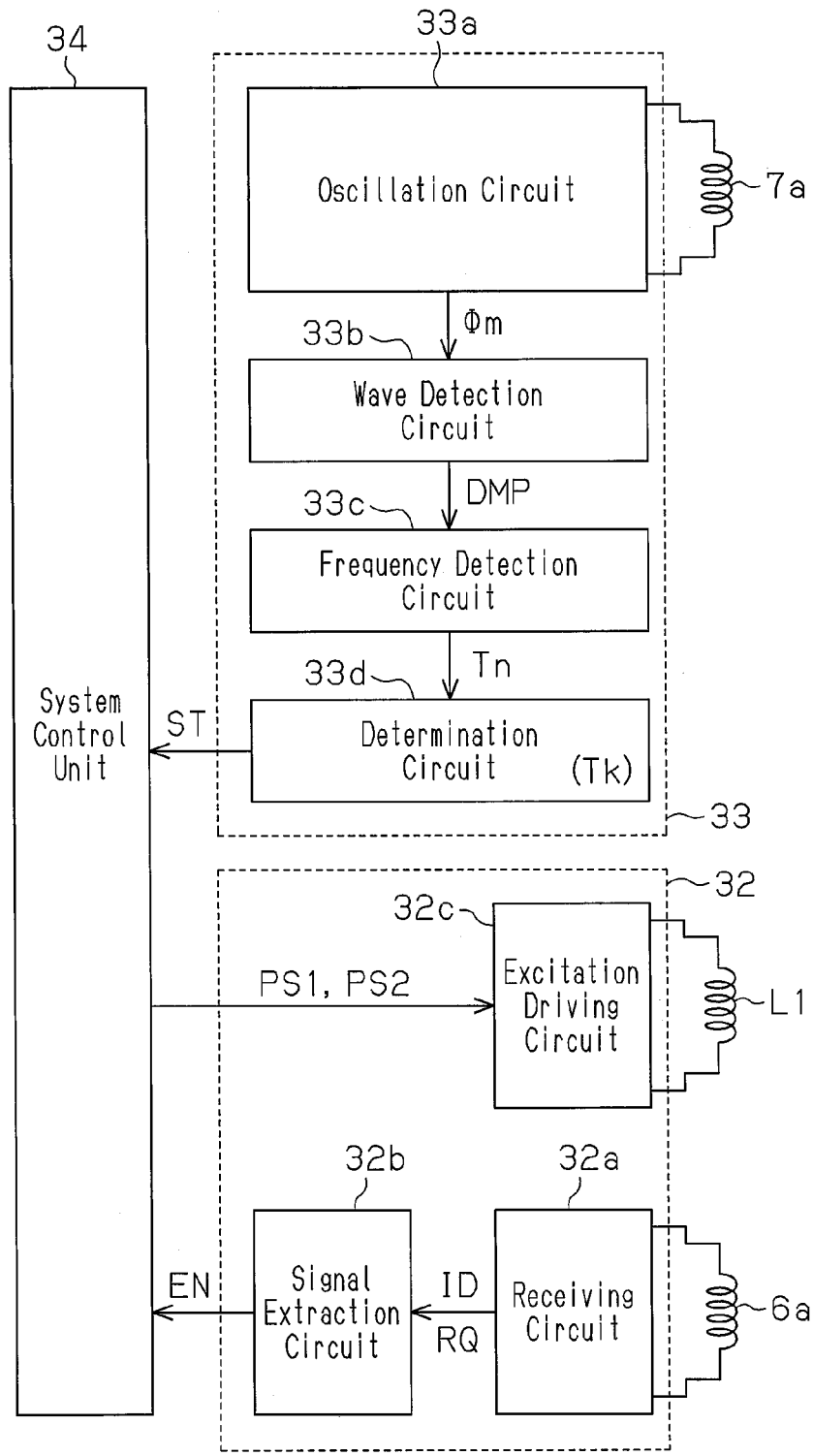
FIG. 8 is a block diagram of a power supply circuit and a metal detection circuit arranged in the power supply device.

As shown in FIG. 8, the power supplying circuit 32 includes a receiving circuit 32a, a signal extraction circuit 32b, and an excitation driving circuit 32c.

The receiving circuit 32a is connected to the power supplying side first antenna coil 6a. The receiving circuit 32a receives, via the power supplying side first antenna coil 6a, a signal transmitted from the power receiving side first antenna coil 6b of the appliance E set on the setting surface 5 and provides the signal to the signal extraction circuit 32b.

The signal extraction circuit 32b extracts an appliance authorization signal ID and an excitation request signal RQ from the transmitted signal. When the appliance authorization signal ID and the excitation request signal RQ are both extracted from the transmitted signal, the signal extraction circuit 32b provides a permission signal EN to the system control unit 34. When extracting only one of the appliance authorization signal ID and the excitation request signal RQ or when extracting none of the two signals, the signal extraction circuit 32b does not provide the system control unit 34 with the permission signal EN.

The excitation driving circuit 32c is connected to the primary coil L1. In the present embodiment, the excitation driving circuit 32c and the primary coil L1 form a half bridge circuit. The excitation driving circuit 32c includes two switching transistors such as metal oxide semiconductor (MOS) transistors.

The gate terminals of the two transistors are provided with excitation signals PS1 and PS2, which are activation and deactivation pulse signals, from the system control unit 34. The excitation signals PS1 and PS2 input to the gate terminals of the two transistors are complementary signals. When one of the transistors is activated in response to one of the excitation signals, the other transistor is deactivated in response to the other excitation signal.

In one example, when the appliance E is set on the setting surface 5 and the signal extraction circuit 32b continues to provide the permission signal EN to the system control unit 34, the system control unit 34 continues providing the excitation signals PS1 and PS2. In this case, the excitation driving circuit 32c continuously excites and drives the primary coil L1.

When no appliance E is set on the setting surface 5, the system control unit 34 intermittently outputs the excitation signals PS1 and PS2 for only a predetermined period of time. Accordingly, in this case, the excitation driving circuit 32c intermittently excites and drives the primary coil L1 in fixed intervals.

The intermittent excitation driving of the primary coil L1 supplies just enough secondary power to charge a charger of the load Z when the appliance E is set on the setting surface 5 instead of supplying secondary power that can immediately drive the load Z of the appliance E. The charging voltage drives the data generation circuit 15b and the transmission circuit 15c of in the appliance E to perform wireless communication with the power supply device 1.

The intermittent excitation driving of the primary coil L1 does not inductively heat a metal piece 8, if present on the setting surface 5, to a high temperature.

When the signal extraction circuit 32b is not outputting the permission signal EN, the excitation driving circuit 32c intermittently excites and drives the primary coil L1 in the same manner as when no appliance E is set on the setting surface 5.

When the system control unit 34 is being provided with the metal detection signal ST from the metal detection circuit 33, the excitation driving circuit 32c intermittently excites and drives the primary coil L1 in the same manner as when no appliance E is set on the setting surface 5. Accordingly, even when a metal piece 8 is present on the setting surface 5, the primary coil L1 is excited and driven intermittently. Thus, the metal piece 8 is not inductively heated to a high temperature.

As shown in FIG. 8, the metal detection circuit 33 includes an oscillation circuit 33a, a wave detection circuit 33b, a frequency detection circuit 33c, and a determination circuit 33d.

In the present embodiment, the oscillation circuit 33a is formed by a Clapp oscillation circuit. The oscillation circuit 33a oscillates in synchronization with the intermittent excitation driving performed by the excitation driving circuit 32c. The oscillation circuit 33a transmits the oscillation signal Φt, which is formed by a square wave having a fixed amplitude and a fixed frequency shown in FIG. 9A, from the power supplying side second antenna coil 7a toward the power receiving side second antenna coil 7b of the appliance E set on the setting surface 5.

The oscillation signal Φt generated by the oscillation circuit 33a functions as a carrier signal. More specifically, the appliance E generates a square wave pulse signal MP based on the frequency of the received oscillation signal Φt and transmits, from the power receiving side second antenna coil 7b, a modulated wave signal Φm generated by modulating the amplitude of the received carrier signal (the oscillation signal Φt) in proportion to the square wave pulse signal MP.

Figure 9D:
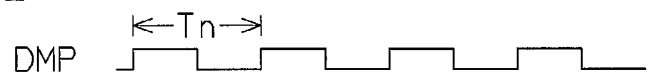
Figure 9E:
FIGS. 9E, 9F, 9G, and 9H are waveform diagrams showing the oscillation signal, square wave pulse signal, modulated wave signal, and demodulated signal when a metal piece is present.
Figure 9F:
Figure 9G:

The modulated wave signal Φm shown in FIG. 9C or 9G generated in the appliance E is then received by the power supplying side second antenna coil 7a of the power supply device 1 and provided to the wave detection circuit 33b via the oscillation circuit 33a.

The wave detection circuit 33b is, for example, an envelope detection circuit. The wave detection circuit 33b detects the waveform of the modulated wave signal Φm provided from the appliance E via the oscillation circuit 33a. Based on the modulated wave signal Φm, the wave detection circuit 33b generates an envelope waveform signal (demodulated signal DMP) that envelopes the modulated wave signal Φm. In other words, the wave detection circuit 33b demodulates the square wave pulse signal MP generated in the appliance E. The wave detection circuit 33b provides the demodulated signal DMP to the frequency detection circuit 33c.

The frequency detection circuit 33c detects the frequency of the demodulated signal DMP. In the present embodiment, the frequency detection circuit 33c detects the rising and falling of the square wave pulse signal MP and determines the cycle of the square wave pulse signal MP by measuring the rising time and falling time. In one example, the frequency detection circuit 33c includes a differentiation circuit, a rectification circuit, and a timer.

The differentiation circuit detects the rising and the falling of the square wave pulse signal MP. Among the differentiated signals differentiated by the differentiation circuit, the rectification circuit uses differentiated signals that have fallen to a negative potential as positive-potential differentiated signals. The timer measures the time period between the two differentiated signals output from the rectification circuit.

The frequency detection circuit 33c provides the time measured by the timer to the determination circuit 33d as the cycle Tn of the square wave pulse signal MP.

The determination circuit 33d determines whether a metal piece 8 is present based on the cycle Tn of the square wave pulse signal MP provided from the frequency detection circuit 33c. For example, the determination circuit 33d determines whether a metal piece is present by comparing the cycle Tn of the square wave pulse signal MP provided from the frequency detection circuit 33c with a reference cycle Tk prestored in an internal memory of the determination circuit 33d.

In one example, the reference cycle Tk is the cycle Tn of the square wave pulse signal MP measured by the frequency detection circuit 33c when the modulated wave signal Φm from the appliance E is received by the power supply device 1 in a state in which a metal piece 8 is not present between the setting surface 5 of and the appliance E.

When a metal piece 8 is present on the setting surface 5 of the power supply device 1, the frequency of the oscillation signal Φt received by the appliance E becomes low, and the cycle Tn of the square wave pulse signal MP is prolonged. As a result, the determination circuit 33d determines that a metal piece 8 is present on the setting surface 5 of the power supply device 1 when the cycle Tn of the square wave pulse signal MP provided from the frequency detection circuit 33c exceeds the reference cycle Tk. The determination circuit 33d determines that a metal piece 8 is not present on the setting surface 5 of the power supply device 1 when the cycle Tn of the square wave pulse signal MP provided from the frequency detection circuit 33c is less than or equal to the reference cycle Tk.

The determination circuit 33d notifies the system control unit 34 of its determination result. For example, the determination circuit 33d provides the system control unit 34 with a metal detection signal ST when determining that a metal piece 8 is present on the setting surface 5 of the power supply device 1. The determination circuit 33d does not provide the system control unit 34 with a metal detection signal ST when determining that a metal piece 8 is not present on the setting surface 5 of the power supply device 1.

The system control unit 34 provides the excitation signals PS1 and PS2 to the excitation driving circuit 32c in response to the permission signal EN received from the signal extraction circuit 32b. In the illustrated example, when the signal extraction circuit 32b extracts both of the appliance authorization signal ID and the excitation request signal RQ, the system control unit 34 provides the excitation signals PS1 and PS2 to the excitation driving circuit 32c to continuously excite and drive the primary coil L1.

The system control unit 34 may intermittently provide the excitation signals PS1 and PS2 to the excitation driving circuit 32c. For example, when the signal extraction circuit 32b extracts only one of the appliance authorization signal ID and the excitation request signal RQ or when the circuit 32b does not extract both signals, the system control unit 34 intermittently provides the excitation signals PS1 and PS2 to the excitation driving circuit 32c to intermittently excite and drive the primary coil L1.

The system control unit 34 intermittently provides the excitation signals PS1 and PS2 to the excitation driving circuit 32c in response to the permission signal EN provided from the signal extraction circuit 32b while receiving the metal detection signal ST from the determination circuit 33d. This intermittently excites the primary coil L1.

The system control unit 34 also intermittently oscillates the oscillation circuit 33a of the metal detection circuit 33 to intermittently transmit the oscillation signal Φt from the power supplying side second antenna coil 7a.

The operation of the power supply device 1 will now be described.

When the power switch (not shown) is activated to start supplying commercial power to the power circuit 31, the power circuit 31 supplies the system control unit 34, the power supplying circuit 32, and the metal detection circuit 33 with DC voltage as driving power.

The system control unit 34, when supplied with the driving power from the power circuit 31, intermittently provides the excitation signals PS1 and PS2 to the excitation driving circuit 32c. The excitation driving circuit 32c intermittently excites and drives the primary coil L1 in response to the intermittent excitation signals PS1 and PS2. The power supply device 1 waits for the appliance E to be set on the setting surface 5.

The system control unit 34 also intermittently oscillates the oscillation circuit 33a of the metal detection circuit 33. As a result, the oscillation signal Φt is transmitted intermittently from the power supplying side second antenna coil 7a.

When the appliance E is set on the setting surface 5, the secondary coil L2 of the appliance E receives secondary power that has been supplied by the intermittent excitation driving of the primary coil L1. In the appliance E, the data generation circuit 15b arranged in the power reception circuit 15 generates an appliance authorization signal ID and an excitation request signal RQ with the secondary power and provides the signals ID and RQ to the transmission circuit 15c. The transmission circuit 15c transmits the appliance authorization signal ID and the excitation request signal RQ from the power receiving side first antenna coil 6b toward the power supplying side first antenna coil 6a of the power supply device 1.

In the power supply device 1, the signal extraction circuit 32b extracts the appliance authorization signal ID and the excitation request signal RQ from the signal received via the power supplying side first antenna coil 6a and the receiving circuit 32a. The signal extraction circuit 32b provides a permission signal EN to the system control unit 34 when the appliance authorization signal ID and the excitation request signal RQ are both successfully extracted.

In response to the permission signal EN, the system control unit 34 continuously provides excitation signals PS1 and PS2 to the excitation driving circuit 32c. The excitation driving circuit 32c continuously excites and drives the primary coil L1 in response to the continuous excitation signals PS1 and PS2. As a result, the appliance E set on the setting surface 5 receives the secondary power, which is based on the continuous excitation driving of the primary coil L1, via the secondary coil L2.

In this manner, the load Z of the appliance E is supplied with driving power from the power reception circuit 15 (rectification smoothing circuit 15a).

The power receiving side second antenna coil 7b arranged in the appliance E receives the oscillation signal Φt from the power supplying side second antenna coil 7a. The power receiving side second antenna coil 7b provides the received oscillation signal Φt to the rectification circuit 16a of the modulation circuit 16. The rectification circuit 16a then half-wave rectifies the oscillation signal Φt.

The half-wave rectified oscillation signal Φt is charged to and discharged from the charge-discharge capacitor C0 and the resistor R0 arranged in the rectification circuit 16a. The charging voltage Vt of the charge-discharge capacitor C0 is applied to the modulating wave signal generation circuit 16b (astable multivibrator 20) as the power supply voltage VG.

The charging and discharging time of the charge-discharge capacitor C0 is varied by the frequency of the oscillation signal Φt, that is, by whether or not a metal piece 8 is present on the setting surface 5.

The oscillation signal Φt has a relatively high frequency as shown in FIG. 9A when a metal piece 8 is not present on the setting surface 5. In contrast, the oscillation signal Φt has a relatively low frequency as shown in FIG. 9E when a metal piece 8 is present on the setting surface 5. Accordingly, the charge-discharge capacitor C0 is charged and discharged for longer periods of time when a metal piece 8 is present on the setting surface 5 than when a metal piece 8 is not present on the setting surface 5.

Consequently, the square wave pulse signal MP output from the modulating wave signal generation circuit 16b (the astable multivibrator 20) has a relatively short cycle Tn as shown in FIG. 9B when a metal piece 8 is not present on the setting surface 5. The square wave pulse signal MP has a relatively long cycle Tn as shown in FIG. 9F when a metal piece 8 is present on the setting surface 5. In this manner, the square wave pulse signal MP has a longer cycle Tn when a metal piece 8 is present on the setting surface 5 than when a metal piece 8 is not present.

The square wave pulse signal MP is provided to the gate terminal of the transistor Q3 arranged in the modulation unit 16c to activate and deactivate the transistor Q3. The activation and deactivation of the transistor Q3 (square wave pulse signal MP) causes the current (oscillation signal Φt) flowing through the power receiving side second antenna coil 7b to undergo amplitude modulation. The current is then transmitted from the power receiving side second antenna coil 7b to the power supplying side second antenna coil 7a as the modulated wave signal Φm.

When a metal piece 8 is not present on the setting surface 5, the modulated wave signal Φm having the waveform shown in FIG. 9C is generated in accordance with the cycle Tn of the square wave pulse signal MP shown in FIG. 9B. When a metal piece 8 is present on the setting surface 5, the resulting modulated wave signal Φm having the waveform shown in FIG. 9G in accordance with the cycle Tn of the square wave pulse signal MP shown in FIG. 9F.

The power supplying side second antenna coil 7a receives the modulated wave signal Φm transmitted from the power receiving side second antenna coil 7b. The modulated wave signal Φm received by the power supplying side second antenna coil 7a is then provided to the wave detection circuit 33b via the oscillation circuit 33a.

The wave detection circuit 33b generates an envelope waveform signal (demodulated signal DMP), which envelopes the modulated wave signal Φm, from the modulated wave signal Φm. That is, the wave detection circuit 33b demodulates the square wave pulse signal MP. The wave detection circuit 33b provides the demodulated signal DMP to the frequency detection circuit 33c.

Figure 9H:

The demodulated signal DMP generated by the wave detection circuit 33b has a relatively short cycle Tn as shown in FIG. 9D when a metal piece 8 is not present on the setting surface 5. The demodulated signal DMP has a relatively long cycle Tn as shown in FIG. 9H when a metal piece 8 is present on the setting surface 5. In this manner, the demodulated signal DMP has a longer cycle Tn when a metal piece 8 is present on the setting surface 5 than when a metal piece 8 is not present.

The wave detection circuit 33b provides the demodulated signal DMP to the frequency detection circuit 33c.

The frequency detection circuit 33c detects the rising and falling of the demodulated signal DMP and measures the cycle Tn of the demodulated signal DMP. The measured cycle Tn of the demodulated signal DMP is longer when a metal piece 8 is present on the setting surface 5 than when a metal piece 8 is not present.

The frequency detection circuit 33c provides the measured cycle Tn of the demodulated signal DMP to the determination circuit 33d. The determination circuit 33d receives the input cycle Tn of the demodulated signal DMP and compares the cycle Tn with the reference cycle Tk.

The determination circuit 33d determines that a metal piece 8 is present on the setting surface 5 of the power supply device 1 when the cycle Tn of the demodulated signal DMP exceeds the reference cycle Tk. In this case, the determination circuit 33d provides a metal detection signal ST to the system control unit 34.

Further, the determination circuit 33d determines that a metal piece 8 is not present on the setting surface 5 of the power supply device 1 when the cycle Tn of the square wave pulse signal MP is less than or equal to the reference cycle Tk. In this case, the determination circuit 33d does not provide a metal detection signal ST to the system control unit 34.

When receiving the metal detection signal ST, the system control unit 34 switches the output of the excitation signals PS1 and PS2 to the excitation driving circuit 32c from continuous output to intermittent output. This intermittently excites the primary coil L1. Thus, the metal piece 8 detected by the metal detection circuit 33 is prevented from being inductively heated. When receiving no metal detection signal ST, the system control unit 34 keeps continuously outputting the excitation signals PS1 and PS2 to the excitation driving circuit 32c. As a result, the primary coil L1 remains continuously excited, and the load Z of the appliance E is continuously supplied with driving power.

The rectification circuit 16a is one example of an oscillation signal receiving circuit. The modulation unit 16c and the astable multivibrator 20 are an example of a modulating wave signal generation circuit.

The first embodiment has the advantages described below.

(1) In the above embodiment, the oscillation circuit 33a of the metal detection circuit 33 arranged in the power supply device 1 transmits an oscillation signal Φt to the modulation circuit 16 of the appliance E. The modulation circuit 16 of the appliance E generates a square wave pulse signal MP from the received oscillation signal Φt. When generating the signal, the modulation circuit 16 changes the cycle Tn of the square wave pulse signal MP is accordance with whether or not a metal piece 8 is present. The modulation circuit 16 then modulates the square wave pulse signal MP to generate a modulated wave signal Φm, and transmits the modulated wave signal Φm to the metal detection circuit 33.

The metal detection circuit 33 of the power supply device 1 determines whether or not a metal piece 8 is present by measuring the cycle Tn of the demodulated signal DMP generated from the modulated wave signal Φm, or the cycle Tn of the square wave pulse signal MP.

In this manner, when detecting for a metal piece 8, the power supply device 1 does not have to change the frequency at which its primary coil L1 is excited to supply power. This eliminates the need for the setting of a plurality of frequencies at which the primary coil L1 is excited in the power supply device 1 and the need for a complicated and expensive control circuit used to switch excitation frequencies. Thus, an inexpensive contactless power supply device can be realized.

The power supply device 1 is simply required to receive the modulated wave signal Φm from the appliance E and demodulate the received signal, and obtain the cycle Tn. This eliminates the need for an expensive circuit that processes signals at high speeds. Thus, an inexpensive contactless power supply device can be realized.

(2) In the above embodiment, the appliance E generates information indicating whether a metal piece 8 is present, that is, the square wave pulse signal MP. This simplifies the circuit configuration and reduces the load in the power supply device 1 and realizes an inexpensive contactless power supply device.

(3) In the above embodiment, the oscillation signal Φt provided from the oscillation circuit 33a of the metal detection circuit 33 is used as a carrier signal when the modulated wave signal Φm is generated. This eliminates the need for a dedicated oscillation circuit to generate a carrier signal.

(4) In the above embodiment, the modulated wave signal Φm is an amplitude-modulated signal. Thus, the circuit for generating the amplitude-modulated wave signal Φm is simpler and obtained at a lower cost than circuits for generating a modulated wave signal through other modulation processes, such as frequency modulation. For the same reason, the wave detection circuit 33b that demodulates the modulated wave signal Φm is simple and inexpensive.

(5) In the above embodiment, the charging voltage Vt for the charge-discharge capacitor C0 of the rectification circuit 16a is provided as the power supply voltage VG to the astable multivibrator 20 of the modulating wave signal generation circuit 16b. The oscillation cycle of the astable multivibrator 20 is changed based on the power supply voltage VG that is varied by the presence of a metal piece 8. This generates the square wave pulse signal MP with the cycle Tn that changes based on whether or not the metal piece 8 is present.

As a result, the modulating wave (square wave pulse signal MP) used for detecting the presence of a metal piece 8 can be generated by the astable multivibrator 20, which has a simple circuit configuration.

The above embodiment may be modified in the following forms.

In the above embodiment, the oscillation signal Φt transmitted from the oscillation circuit 33a of the power supply device 1 is used as the carrier signal. Alternatively, the appliance E may generate the carrier signal. In this case, the modulation circuit 16 may additionally include an oscillation circuit for generating the carrier signal. The carrier signal generated by the oscillation circuit may be modulated in accordance with the square wave pulse signal MP (modulating wave) to generate a modulated wave signal, which is transmitted to the power supply device 1.

In the above embodiment, the modulated wave signal Φm is transmitted from the power receiving side second antenna coil 7b to the power supplying side second antenna coil 7a. Alternatively, the modulated wave signal Φm generated by the modulation circuit 16 may be superimposed on an electromagnetic wave signal generated based on the power supplying current supplied from the primary coil L1 of the power supply device 1 to the secondary coil L2 of the appliance E by using the electromagnetic induction phenomenon. The superimposed signal may then be received via the primary coil L1, and the modulated wave signal Φm may be demodulated from the superimposed signal by the wave detection circuit 33b of the metal detection circuit 33.

In the above embodiment, the frequency detection circuit 33c detects the rising and falling of the square wave pulse signal MP and measures the rising time and falling time to obtain the cycle Tn of the square wave pulse signal MP. Alternatively, the cycle Tn of the square wave pulse signal MP may be obtained by sampling the square wave pulse signal MP with sampling signals having extremely short cycles. In this case, the cycle Tn of the square wave pulse signal MP is obtained based on the number of signals sampled at a high potential (high level) of the square wave pulse signal MP and the number of signals sampled at a low potential (low level) of the square wave pulse signal MP.

Although the embodiments according to the present invention have been described with reference to the accompanying drawings, the present invention is not restrictive to the foregoing description and may be modified within the scope and equivalence of the appended claims.

The invention claimed is:

1. A method for detecting whether or not a metal foreign object is present on a contactless power supply device that supplies power to a power reception device included in an electrical appliance using an electromagnetic induction phenomenon, the method comprising:
   transmitting an oscillation signal from the contactless power supply device to the power reception device;
   detecting, from the oscillation signal received by the power reception device, a modulating wave based on a change in magnetic flux caused by the presence of a metal foreign object;
   generating a modulated wave signal by modulating a carrier signal in accordance with the modulating wave to transmit the modulating wave to the contactless power supply device, and transmitting the modulated wave signal from the power reception device to the contactless power supply device; and
   receiving the modulated wave signal transmitted from the power reception device with the contactless power supply device, and determining whether or not a metal foreign object is present based on comparison between a reference cycle and the cycle of a demodulated signal demodulated from the modulated wave signal, the cycle of the demodulated signal corresponding to the cycle of the modulating wave.

2. The metal foreign object detecting method according to claim 1, wherein
   the modulating wave is a square wave pulse signal derived from the oscillation signal received by the power reception device and having a cycle changed based on a change in magnetic flux caused by the presence of a metal foreign object,
   the modulated wave signal is generated by modulating an amplitude of the carrier signal in proportion to the square wave pulse signal, and
   the demodulated signal is a square wave pulse signal generated by detecting an envelope of the modulated wave signal.

3. The metal foreign object detecting method according to claim 1, wherein the carrier signal is the oscillation signal transmitted from the contactless power supply device to the power reception device.

4. The metal foreign object detecting method according to claim 1, wherein
   the carrier signal is an electromagnetic wave signal generated based on a supplying current supplied to a secondary coil included in the power reception device, using an electromagnetic induction phenomenon, from a primary coil arranged in the contactless power supply device, and
   the modulated wave signal is obtained by superimposing the modulating wave onto the electromagnetic wave signal.

5. A contactless power supply device that supplies power to a power reception device included in electric appliance using an electromagnetic induction phenomenon, the contactless power supply device comprising:
   an oscillation circuit that transmits an oscillation signal to the power reception device;
   a wave detection circuit that receives, from the power reception device receiving the oscillation signal, a modulated wave signal obtained by modulating the oscillation signal with a modulating wave based on a change in magnetic flux, detects the modulated wave signal, and demodulates the modulated wave signal detected by the power reception device;
   a frequency detection circuit that detects a frequency of the modulating wave demodulated by the wave detection circuit; and
   a determination circuit that determines whether or not a metal foreign object is present based on comparison between a reference cycle and the cycle corresponding to the frequency of the demodulated modulating wave detected by the frequency detection circuit, the cycle of the demodulated modulating wave corresponding to the cycle of the modulating wave.

6. The contactless power supply device according to claim 5, wherein
   the modulating wave is a square wave pulse signal derived from the oscillation signal received by the power reception device and having a cycle changed based on a change in magnetic flux caused by the presence of a metal foreign object,
   the modulated wave signal is generated by modulating an amplitude of the carrier signal in proportion to the square wave pulse signal, and
   the wave detection circuit is configured to demodulate the square wave pulse signal by detecting an envelope of the modulated wave signal,
   the frequency detection circuit is configured to detect a cycle of the square wave pulse signal demodulated by the wave detection circuit, and
   the determination circuit determines whether a metal foreign object is present based on the cycle of the square wave pulse signal detected by the frequency detection circuit.

7. The contactless power supply device according to claim 6, wherein the carrier signal is the oscillation signal transmitted from the oscillation circuit to the power reception device.

8. The contactless power supply device according to claim 5, wherein the reference cycle is prestored in the determination circuit.

9. A contactless power supply system comprising a power reception device, which is included in an electric appliance, and a contactless power supply device, which supplies power to the power reception device using an electromagnetic induction phenomenon, wherein
   the contactless power supply device includes
      an oscillation circuit that transmits, to the power reception device, an oscillation signal having a fixed frequency used to detect whether or not a metal foreign object is present,
      a wave detection circuit that receives, from the power reception device receiving the oscillation signal, a modulated wave signal obtained by modulating the oscillation signal with a modulating wave based on a change in magnetic flux, detects the modulated wave signal, and demodulates the modulated wave signal detected by the power reception device,
      a frequency detection circuit that detects a frequency of a demodulated modulating wave demodulated by the wave detection circuit, and
      a determination circuit that determines whether a metal foreign object is present based on comparison between a reference cycle and the cycle corresponding to the frequency of the demodulated modulating wave detected by the frequency detection circuit, the cycle of the demodulated modulating wave corresponding to the cycle of the modulating wave, and
   the power reception device includes
      an oscillation signal receiving circuit that receives the oscillation signal transmitted from the contactless power supply device, a modulating wave signal generation circuit that generates, from the oscillation signal received by the oscillation signal receiving circuit, the modulating wave, and a modulated wave signal generation circuit that generates a modulated wave signal by modulating a carrier signal in accordance with the modulating wave to transmit the modulating wave to the contactless power supply device.

10. The contactless power supply system according to claim 9, wherein the modulating wave is a square wave pulse signal, the modulating wave signal generation circuit of the power reception device is configured to generate the square wave pulse signal, from the received oscillation signal, with a cycle changed based on a change in magnetic flux caused by the presence of a metal foreign object, the modulated wave signal is generated by modifying an amplitude of the carrier signal in proportion to the square wave pulse signal, the modulated wave signal generation circuit of the power reception device is configured to generate the modulated wave signal by modulating an amplitude of the carrier signal in proportion to the square wave pulse signal, the wave detection circuit of the contactless power supply device is configured to demodulate the square wave pulse signal by detecting an envelope of the modulated wave signal, the frequency detection circuit of the contactless power supply device is configured to detect a cycle of the square wave pulse signal demodulated by the wave detection circuit, and the determination circuit of the contactless power supply device determines whether or not a metal foreign object is present based on the cycle of the square wave pulse signal detected by the frequency detection circuit.

11. The contactless power supply system according to claim 9, wherein the carrier signal is the oscillation signal transmitted from the oscillation circuit of the contactless power supply device to the oscillation signal receiving circuit of the power reception device.

12. The contactless power supply device according to claim 9, wherein the reference cycle is prestored in the determination circuit.

* * * * *